(12) United States Patent
Lesea

(10) Patent No.: US 6,445,238 B1
(45) Date of Patent: Sep. 3, 2002

(54) METHOD AND APPARATUS FOR ADJUSTING DELAY IN A DELAY LOCKED LOOP FOR TEMPERATURE VARIATIONS

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/452,234

(22) Filed: Dec. 1, 1999

(51) Int. Cl.$^7$ .............................................. H03H 11/26
(52) U.S. Cl. ....................................... 327/262; 327/512
(58) Field of Search ................................ 327/262, 270, 327/271, 277, 284, 512, 513; 377/25; 365/211

(56) References Cited

U.S. PATENT DOCUMENTS

| | | | | |
|---|---|---|---|---|
| 4,789,976 A | * | 12/1988 | Fujishima | 369/54 |
| 4,922,141 A | * | 5/1990 | Lofgren et al. | 327/158 |
| 4,980,586 A | * | 12/1990 | Sullivan et al. | 327/262 |
| 5,039,893 A | * | 8/1991 | Tomisawa | 327/276 |
| 5,359,303 A | * | 10/1994 | Mirow | 331/176 |
| 5,483,265 A | * | 1/1996 | Kneezel et al. | 347/14 |
| 5,638,418 A | * | 6/1997 | Douglas et al. | 377/25 |
| 5,956,289 A | * | 9/1999 | Norman et al. | 365/211 |
| 6,115,441 A | * | 9/2000 | Douglas et al. | 377/25 |

OTHER PUBLICATIONS

R. Jacob Baker, Harry W. Li, David E. Boyce, "CMOS Circuit Design, Layout, and Simulation", IEEE Press Series on Microelectronic Systems, Stuart K. Tewksbury, Series Editor, Copyright 1998, pp. 477–479.

* cited by examiner

Primary Examiner—Timothy P. Callahan
Assistant Examiner—Linh Nguyen
(74) Attorney, Agent, or Firm—William L. Paradice, III; Edel M. Young

(57) ABSTRACT

The supply voltage to which a delay circuit's buffer stages are coupled is adjusted in response to changes in temperature according to a predetermined relationship to maintain a substantially constant buffer stage gate delay over temperature variations. Decreasing gate delays resulting from decreases in temperature are offset by decreasing the supply voltage, which in turn increases gate delays. Conversely, increasing gate delays resulting from increases in temperature are offset by increasing the supply voltage, which in turn decreases gate delays. In some embodiments, a control circuit is connected to the reference voltage circuit that supplies $V_{CC}$ to the delay circuit, and adjusts $V_{CC}$ in response to temperature to maintain substantially constant gate delay over temperature. In one embodiment, the control circuit includes a microprocessor and a look-up table containing desired supply voltage versus temperature mappings. In another embodiment, the control circuit is formed as part of an existing bandgap reference circuit associated with the reference voltage circuit, and therefore consumes minimal silicon area.

7 Claims, 5 Drawing Sheets

US 6,445,238 B1

METHOD AND APPARATUS FOR ADJUSTING DELAY IN A DELAY LOCKED LOOP FOR TEMPERATURE VARIATIONS

FIELD OF THE INVENTION

This invention relates generally to digital systems and specifically to maintaining clock speeds in the presence of temperature variations.

BACKGROUND OF THE INVENTION

As modern digital electronic systems become larger and more complex, quality on-chip clock distribution becomes increasingly important. Propagation delays across an integrated circuit's clock distribution network result in undesirable clock skew, which in turn may adversely impact performance of the integrated circuit. A delay-locked loop (DLL) may be used to compensate for propagation delays across a clock distribution network by sufficiently delaying an input clock signal before applying it to the distribution network so that it is in phase with an output clock signal of the distribution network.

FIG. 1 shows a system 1 having a DLL 10 connected to a clock distribution network 15. DLL 10 includes a programmable delay line 11 and control logic 12. An input clock signal CLK_IN is coupled to input terminals of programmable delay line 11 and control logic 12. Programmable delay line 11 produces a delayed clock signal CLK_OUT, which in turn is coupled as an input clock signal to clock distribution network 15. CLK_OUT is routed across clock distribution network 15, which is tapped at a selected point and provided as a feedback signal CLK_FB to control logic 12. Control logic 12 compares the respective phases of CLK_IN and CLK_FB and, in response thereto, provides a control signal to programmable delay line 11. In response to the control signal provided by control logic 12, programmable delay line 11 delays CLK_IN until CLK_IN is in phase with CLK_OUT, e.g., until their respective rising edges align. Once the clock signals are in phase, the DLL locks, and thereafter maintains CLK_IN and CLK_OUT in phase with each other.

A DLL's programmable delay line typically includes many individually selectable buffer stages that allow for the delay inserted into a clock signal to be incrementally changed without causing glitches in the clock signal. Buffer stages are typically formed using CMOS inverters. For example, FIG. 2 shows a conventional buffer stage 2 as having two series-connected CMOS inverters coupled between a voltage supply $V_{CC}$ and ground potential. The gate delays of the CMOS inverters provide the incremental delays of the programmable delay line.

The gate delay associated with each buffer stage is dependent upon fabrication process considerations such as, for instance, implant and threshold voltage levels, and thus may change with variations in the fabrication process. Since a delay line typically includes many buffer stages, relatively small changes in the buffer stage gate delay may produce a significant change in the cumulative delay of the delay line, which in turn may result in an undesirable shift in operating frequency. Accordingly, it is desirable to maintain a constant buffer stage gate delay over process variations in order to prevent undesirable shifts in the operating frequency.

The delay of each buffer stage is also dependent upon temperature. As temperature increases, circuit speed decreases, which in turn results in longer (e.g., slower) gate delays for the buffer stage. Conversely, as temperature decreases, circuit speed increases, which in turn results in a shorter (e.g., faster) gate delays. For example, where a buffer stage may provide a 600 picosecond delay at 80° Celsius, the same buffer stage may provide a delay of 500 picoseconds at 0° Celsius. Thus, in this example, the buffer stage delay is 20% faster at 0° Celsius than it is at 80° Celsius. The resultant increase in buffer stage gate delay at low temperatures may undesirably increase the minimum operating frequency at which the delay line is able to lock. The resulting shift in minimum operating frequency may preclude synchronization with associated circuits, and thus may violate specified operating parameters.

One solution to maintaining a specified minimum operating frequency at low temperatures is to provide additional buffer stages in the delay line. These additional buffer stages are selected at lower temperatures to increase the total delay along the delay line, and thereby compensate for faster delays associated with low temperatures. Although effective in compensating for faster delays at low temperatures, providing additional buffer stages in a delay line undesirably increases silicon area and manufacturing costs. Thus, it is desirable to maintain delay of the delay line at low temperatures without providing additional delay stages.

SUMMARY OF THE INVENTION

A method and apparatus are disclosed that maintain a substantially constant gate delay over a temperature range. In accordance with the present invention, the supply voltage to which a delay circuit's buffer stages are coupled is adjusted in response to changes in temperature according to a predetermined relationship in order to maintain a substantially constant delay in the delay line over a range of temperatures. Decreasing gate delays of gates in the delay line resulting from decreases in temperature are offset by decreasing the supply voltage, which in turn increases gate delays. Conversely, increasing gate delays resulting from increases in temperature are offset by increasing the supply voltage, which in turn decreases gate delays.

Providing a supply voltage $V_{CC}$ that changes with temperature in accordance with present embodiments is in marked contrast to prior art teachings of maintaining a constant voltage over a temperature range. Indeed, voltage supplies which use bandgap reference circuits to maintain a constant supply voltage over a temperature range are well-known. Here, slowing circuit speed at low temperatures by decreasing the supply voltage, as implemented according to present embodiments, is contrary to the conventional wisdom of increasing operating speeds at low temperatures.

In some embodiments, a control circuit is connected to the reference voltage circuit that supplies $V_{CC}$ to the delay circuit, and adjusts $V_{CC}$ in response to temperature to maintain substantially constant gate delay of gates in a delay line over the temperature range. In one embodiment, the control circuit includes a microprocessor and a look-up table embodying a desired supply voltage versus temperature relationship. In another embodiment, the control circuit is formed as part of an existing bandgap reference circuit associated with the reference voltage circuit, and therefore consumes minimal silicon area.

Like components in the figures are similarly labeled.

DETAILED DESCRIPTION OF THE INVENTION

The present invention maintains a substantially constant delay for a delay circuit over a temperature range by automatically adjusting a supply voltage of the delay circuit in response to temperature variations. In one embodiment, the delay circuit is a conventional delay line having a plurality of buffer stages, with each buffer stage having an associated gate delay. The gate delay variation is proportional to temperature and inversely proportional to supply voltage. Thus, increasing the supply voltage of the buffer stage increases circuit speed, which in turn results in smaller delays. Conversely, decreasing the supply voltage of the buffer stage decreases circuit speed, which in turn results in greater delays.

The relationship between gate delay and temperature is approximately linear, and the relationship between gate delay and supply voltage is also approximately linear.

Thus, in accordance with the present invention, changes in gate delay resulting from temperature variations may be precisely offset by complementary changes in gate delay caused by corresponding variations in supply voltage. In this manner, present embodiments utilize relationships between gate delay and temperature and between gate delay and supply voltage to determine a corresponding relationship between supply voltage and temperature, which results in a substantially constant gate delay over a temperature range.

Figure 3:
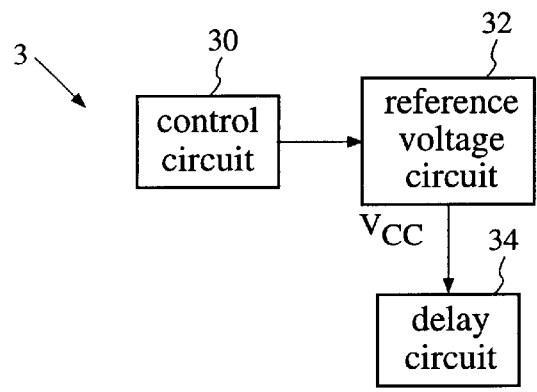
FIG. 3 is a block diagram of a system in accordance with the present invention that adjusts the supply voltage in response to temperature variations to maintain a constant gate delay.
Figure 8:
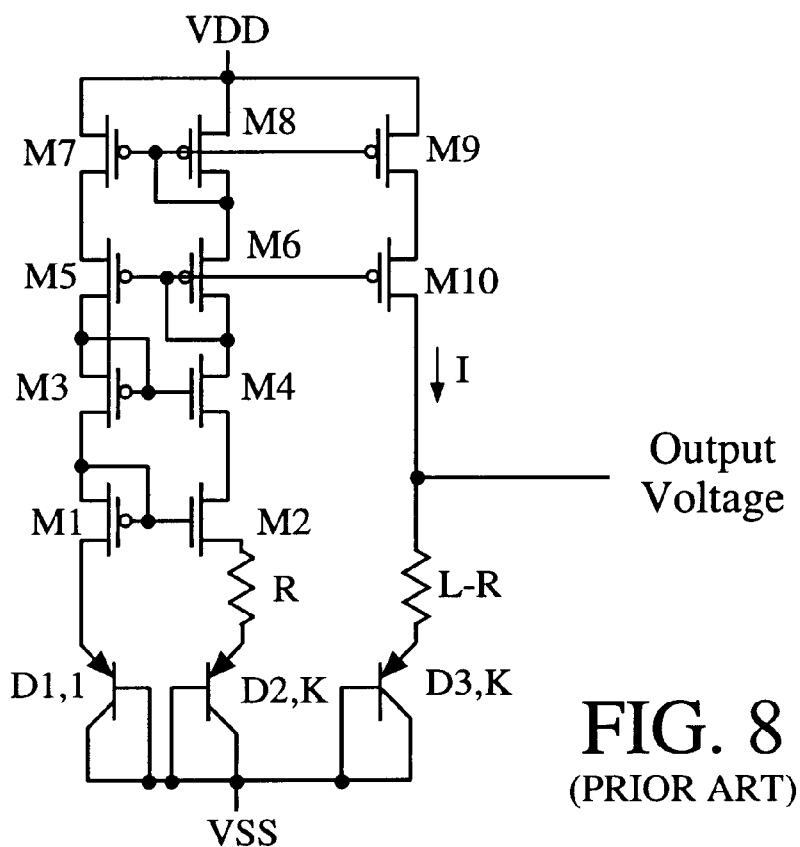
FIG. 8 shows a prior art circuit appropriate for reference voltage circuit 32 of FIG. 3.
Figure 9:
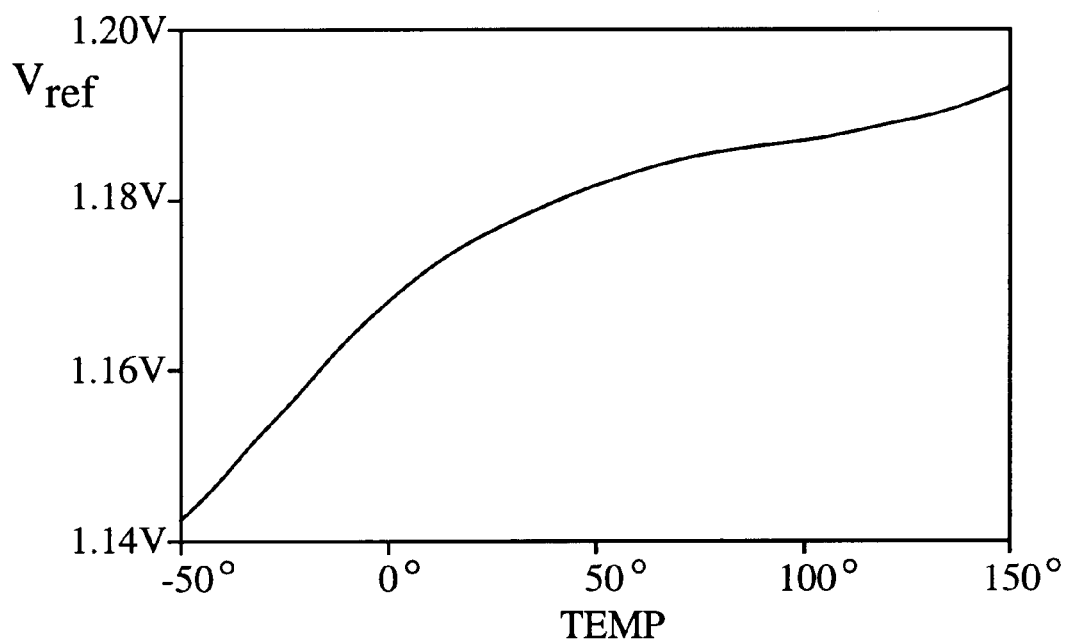
FIG. 9 shows the temperature response of the circuit of FIG. 8 under selected conditions.

FIG. 3 shows a system 3 having a control circuit 30, a reference voltage circuit 32, and a delay circuit 34. Reference voltage circuit 32 provides supply voltage $V_{CC}$ to delay circuit 34. In one embodiment, reference voltage circuit 32 is a bandgap reference circuit of the type described by Baker, Li, and Boyce in "CMOS Circuit Design, Layout, and Simulation," pp. 477–479 (1998), This circuit is shown in FIG. 8. As discussed by Baker, et al., in FIG. 8, diode D3 is the same size as diode D2, while the resistor in series with diode D3 is L times larger than the resistor in series with diode D2. This circuit generates a reference voltage that varies with temperature as shown in FIG. 9. The output reference voltage with respect to VSS varies as the logarithm of temperature, as further described by Baker et al., incorporated herein by reference.

Alternatively, other well-known reference voltage supplies may be used.

Figure 1:
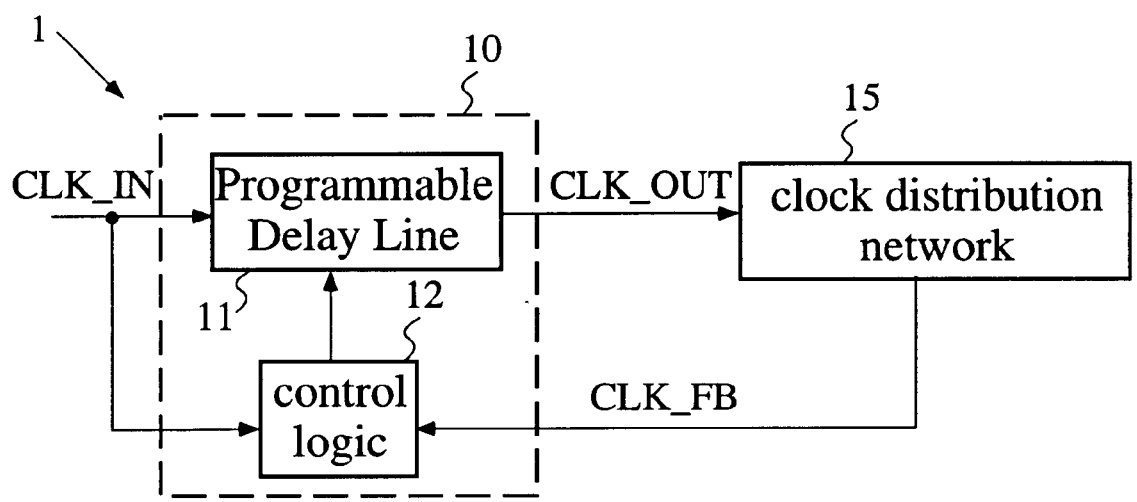
FIG. 1 is a block diagram of a system including a conventional delay locked loop.
Figure 2:
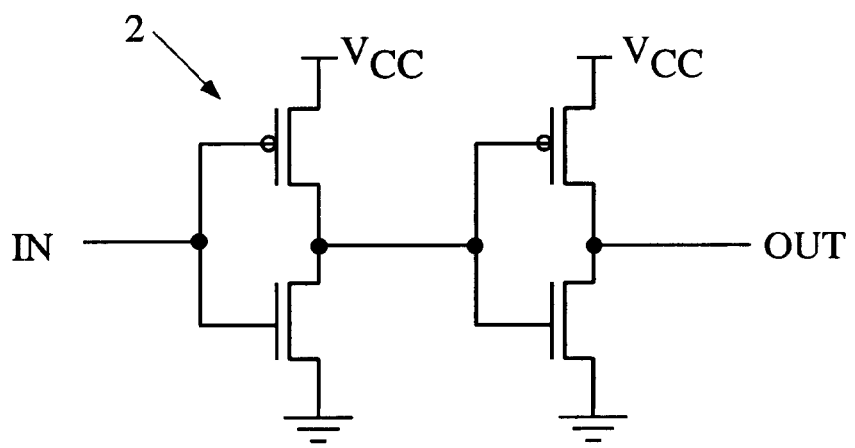
FIG. 2 is a schematic diagram of a conventional buffer stage of a delay circuit.

In one embodiment, delay circuit 34 is a programmable delay line having a plurality of individually selectable buffer stages of the type shown in FIG. 2, although other gate delay stages may be used. Control circuit 30 adjusts $V_{CC}$ in response to temperature variations to maintain substantially constant gate delays for buffer stages within delay circuit 34.

Figure 4:
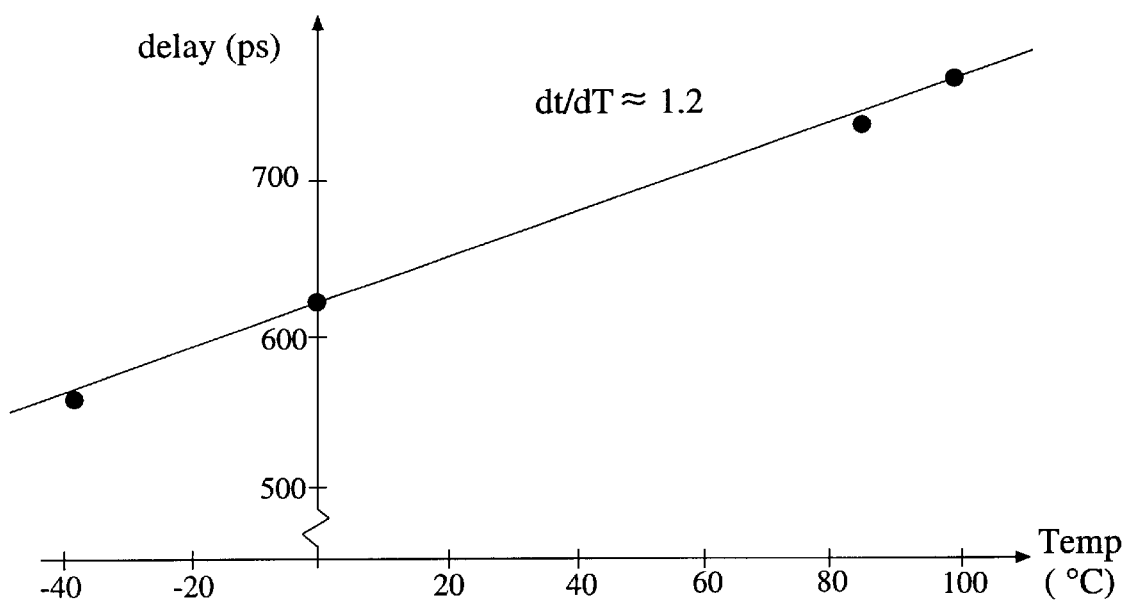
FIG. 4 is a plot of gate delay versus temperature for a buffer stage in one embodiment of the present invention.
Figure 5:
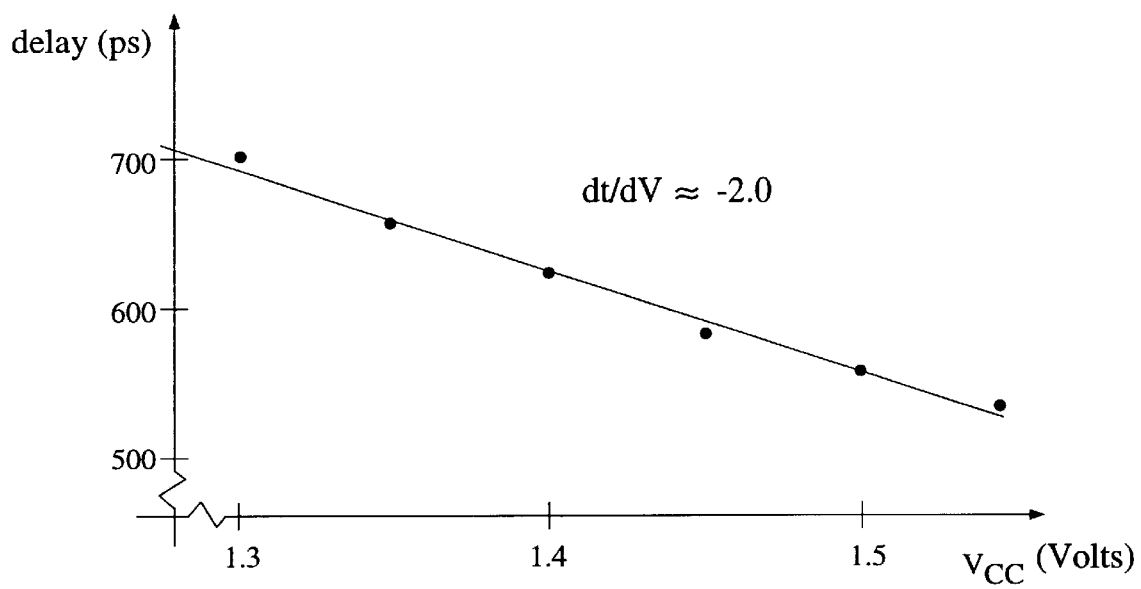
FIG. 5 is a plot of gate delay versus supply voltage for a buffer stage in one embodiment of the present invention.

FIG. 4 shows the approximately linear relationship between gate delay and temperature for a buffer stage of the type shown in FIG. 2, and FIG. 5 shows the approximately linear relationship between gate delay and supply voltage for that buffer stage. Referring to FIG. 4, the slope of the gate delay versus temperature plot is approximately 1.2 picoseconds per degree Celsius, i.e., dt/dT=1.2 ps/° C. Referring to FIG. 5, the slope of the gate delay versus supply voltage plot is approximately 2.0 picoseconds per millivolt, i.e., dt/dV= 2.0 ps/mV. To offset changes in gate delay resulting from temperature variations with complementary changes in gate delay caused by adjusting the supply voltage, control circuit 30 adjusts the supply voltage $V_{CC}$ in response to temperature according to the relationships depicted in FIGS. 4 and 5. Thus, where $$dV/dT = \frac{dt/dT}{dt/dV} = \frac{1.2}{2.0} = 0.60 \text{ mV/° C.},$$

a substantially constant gate delay is maintained by increasing $V_{CC}$ by approximately 0.6 mV for every degree Celsius increase in temperature, and by decreasing $V_{CC}$ by approximately 0.6 mV for every degree Celsius decrease in temperature. In this manner, changes in gate delay resulting from temperature variations are offset by changes in gate delay resulting from supply voltage variations.

Figure 6:
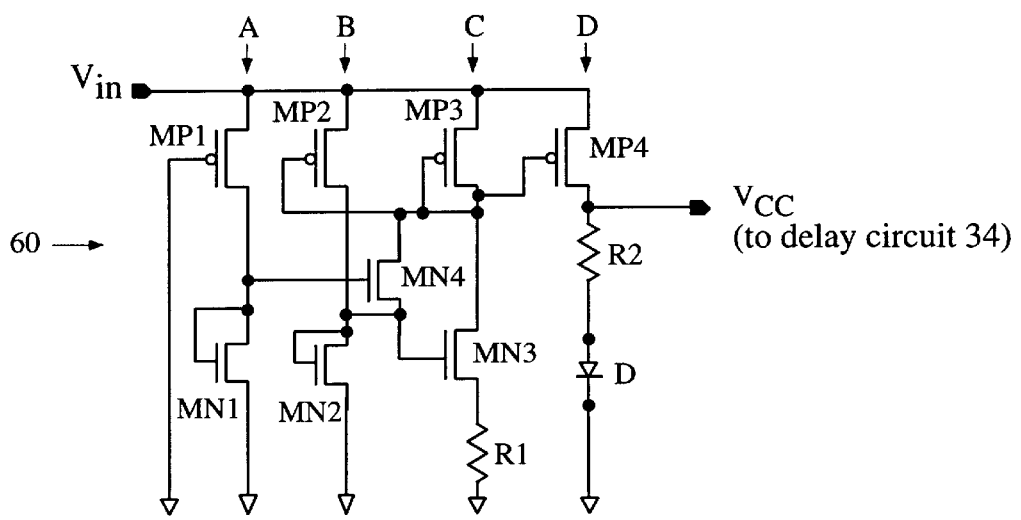
FIG. 6 is a circuit diagram of another embodiment of the control circuit of FIG. 3.

FIG. 6 shows a control circuit 60 that is one embodiment of control circuit 30 of FIG. 3. Circuit 60 includes four legs A, B, C, and D connected between an input voltage $V_{in}$ and ground potential. Leg A includes a PMOS transistor MP1 coupled in series with an NMOS diode-connected transistor MN1. Leg B includes a PMOS transistor MP2 and an NMOS diode-connected transistor MN2. Leg C includes a diode-connected PMOS transistor MP3, an NMOS transistor MN3, and a resistor R1. Leg D includes a PMOS transistor MP4, a resistor R2, and a diode D.

Transistors MP2 and MP4 share a common gate with diode-connected transistor MP3 to form a current mirror. An NMOS transistor MN4 is connected between the common gate of PMOS transistors MP2, MP3, and MP4 and the common gate of NMOS transistors MN2 and MN3. The gate of transistor MN4 is coupled to the gate of diode-connected transistor MN1. The temperature-dependent supply voltage $V_{CC}$ is provided at a node between PMOS transistor MP4 and resistor R2.

PMOS transistor MP1 has its gate coupled to ground potential, and turns on when $V_{in}$ exceeds its threshold voltage $V_T$. As current flows through transistor MP1, the gate voltage of transistor MN4 increases to one diode drop above ground potential, following the anode voltage of diode-connected transistor MN1, thereby turning on transistor MN4. The start-up voltage for transistor MN4 provided by transistors MP1 and MN1 maintains transistor MN4 in its linear region. Once conductive, transistor MN4 sets up a constant current through transistors MP3 and MN2. Current flow in transistor MP3 is mirrored in transistors MP2 and MP4.

PMOS transistors MP2, MP3, and MP4 are matched in size with respect to one another so that the respective currents in transistors MP2, MP3 and MP4 are equal to one another. The current sourced by transistor MP4 through resistor R2 develops a constant voltage across resistor R2. The voltage across resistor R2 and the voltage drop across diode D sum to produce the supply voltage $V_{CC}$, which in turn is provided by circuit 32 to delay circuit 34.

The temperature coefficients of the various transistors, resistors, and diodes of circuit 60 are manipulated to provide a desired overall positive temperature coefficient for circuit 60 so that gate delays within delay circuit 34 remain substantially constant over the temperature range. As mentioned above, in one embodiment the desired value for the temperature coefficient, i.e., dV/dT, is approximately 0.6 mV/° C. In one embodiment, diode D has a negative temperature coefficient of approximately 2 mV/° C. Thus, for every degree Celsius increase in temperature, the voltage drop across diode D (and thus $V_{CC}$) decreases by approximately 2 mV, and conversely, for every degree Celsius decrease in temperature, the voltage drop across diode D (and thus $V_{CC}$) increases by approximately 2 mV. Here, the negative temperature coefficient of diode D is offset by the positive temperature coefficients of transistors MP2, MP3, and MP4 to provide a desired positive temperature coefficient, i.e., dV/dT, of approximately 0.6 mV/° C. for circuit 60. Resistor R1 has a temperature coefficient which offsets the temperature coefficient of resistor R2.

The temperature coefficient of each transistor MP2, MP3, and MP4 is controlled by adjusting the transistor's channel length. Increasing the transistor channel length increases the positive temperature coefficient and, conversely, decreasing the transistor channel length decreases the positive temperature coefficient. Accordingly, in accordance with the present invention, the channel lengths of transistors MP2, MP3, and MP4 are selected to be of a length which provides a corresponding positive temperature coefficient that, when combined with the negative temperature coefficient of diode D, produces the desired dV/dT of approximately 0.6 mV/° C. for circuit 60. In this manner, the overall temperature coefficient of the supply voltage $V_{CC}$ provided by circuit 60 is utilized to automatically offset changes in gate delay resulting from temperature variations.

Figure 7:
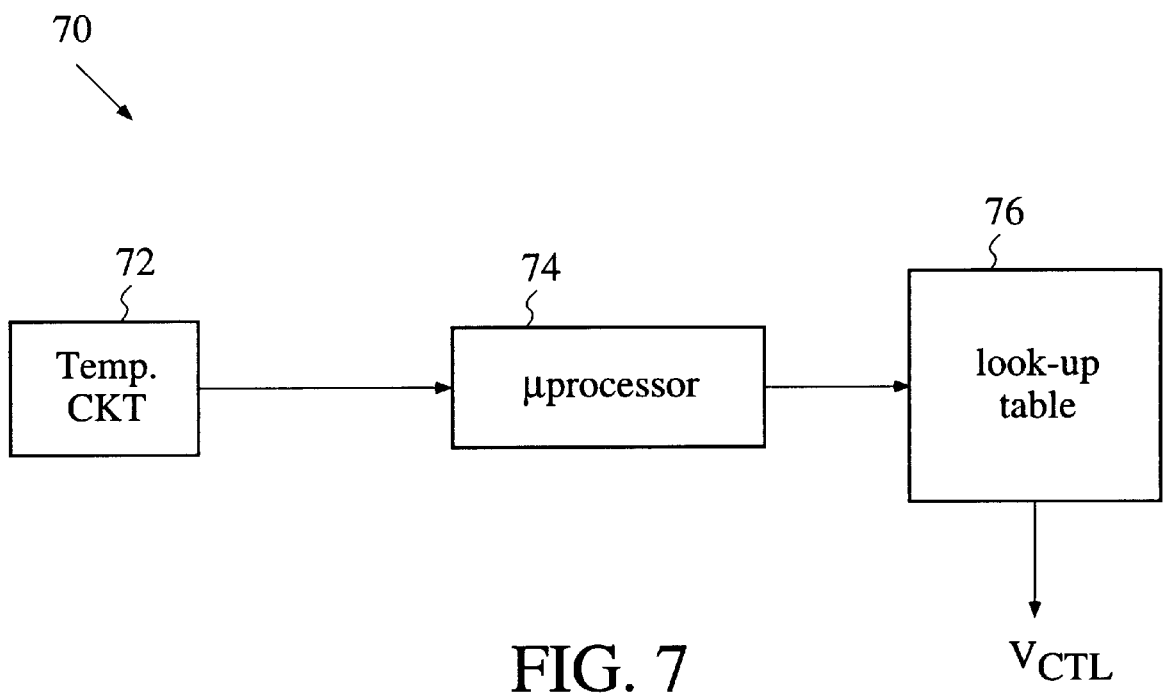
FIG. 7 is a block diagram of one embodiment of the control circuit of FIG. 3.

FIG. 7 shows a control circuit 70 that is another embodiment of control circuit 30 of FIG. 3. Control circuit 70 includes a temperature measuring circuit 72, a microprocessor 74, and a look-up table 76. The relationship between supply voltage and temperature is embodied in look-up table 76. Temperature measuring circuit 72, which may be any well-known device for measuring temperature, measures and then provides the ambient temperature of delay circuit 34 to look-up table 76 via microprocessor 74. In response to the temperature received from microprocessor 74, look-up table 76 outputs a control signal $V_{CTL}$ indicative of the value of $V_{CC}$ that results in offsetting the change in gate delay at the measured temperature.

While particular embodiments of the present invention have been shown and described, it will be obvious to those skilled in the art that changes and modifications may be made without departing from this invention in its broader aspects and, therefore, the appended claims encompass within their scope all such changes and modifications as fall within the true spirit and scope of this invention.

What is claimed is:

1. A method of maintaining a substantially constant gate delay for a buffer stage over a temperature range, the method comprising:
   determining temperature of the buffer stage; and
   adjusting the supply voltage according to a predetermined supply voltage versus temperature relationship to offset a change in gate delay resulting from a variation in temperature with a complementary change in gate delay caused by adjusting the supply voltage, wherein the predetermined supply voltage versus temperature relationship comprises:
   determining a gate delay versus temperature relationship for the buffer stage;
   determining a gate delay versus supply voltage relationship for the buffer stage; and
   combining the gate delay versus temperature relationship and the gate delay versus supply voltage relationship.

2. The method of claim 1, further comprising providing the supply voltage to the buffer stage using a reference voltage circuit.

3. The method of claim 1, wherein the supply voltage is increased in response to increases in temperature.

4. The method of claim 1, wherein the supply voltage is decreased in response to decreases in temperature.

5. A control circuit for maintaining a substantially constant gate delay for a buffer stage, the control circuit comprising:
   an input terminal coupled to receive an input voltage;
   a current source coupled to the input terminal;
   a resistor and a diode connected in series between the current source and ground potential; and
   an output terminal connected between the resistor and the current source to provide a temperature-dependent supply voltage to the buffer stage, wherein a negative temperature coefficient for the diode and a positive temperature coefficient for the current source are manipulated to produce a desired temperature coefficient for the delay circuit such that changes in gate delay resulting from changes in temperature are offset by complementary changes in gate delay resulting from changes in the supply voltage.

6. The control circuit of claim 5, further comprising a second resistor coupled between the input terminal and ground potential, the second resistor having a temperature coefficient which cancels a temperature coefficient of the first resistor.

7. In an integrated circuit, a method of maintaining a substantially constant gate delay for a buffer stage over a temperature range, the method comprising:
   determining temperature of the buffer stage; and
   adjusting the supply according to a predetermined supply voltage versus temperature relationship to offset a change in gate delay resulting from a variation in temperature with a complementary change in gate delay caused by adjusting the supply voltage, wherein the predetermined supply voltage versus temperature relationship is embodied in a look-up table in the integrated circuit.

* * * * *